(12) United States Patent
Ueyama et al.

(10) Patent No.: US 11,172,571 B2
(45) Date of Patent: Nov. 9, 2021

(54) MULTIPIECE ELEMENT STORAGE PACKAGE AND MULTIPIECE OPTICAL SEMICONDUCTOR DEVICE

(71) Applicant: KYOCERA Corporation, Kyoto (JP)

(72) Inventors: Daisuke Ueyama, Nara (JP); Chiaki Doumoto, Goleta, CA (US)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 16/969,722

(22) PCT Filed: Feb. 14, 2019

(86) PCT No.: PCT/JP2019/005449
§ 371 (c)(1),
(2) Date: Aug. 13, 2020

(87) PCT Pub. No.: WO2019/160062
PCT Pub. Date: Aug. 22, 2019

(65) Prior Publication Data
US 2021/0007219 A1     Jan. 7, 2021

(30) Foreign Application Priority Data

Feb. 16, 2018   (JP) .............................. JP2018-025894

(51) Int. Cl.
*H05K 1/02*     (2006.01)
*H01S 5/022*    (2021.01)
*H05K 1/03*     (2006.01)

(52) U.S. Cl.
CPC ............ *H05K 1/0296* (2013.01); *H01S 5/022* (2013.01); *H05K 1/0306* (2013.01); *H05K 2201/10121* (2013.01); *H05K 2201/10522* (2013.01)

(58) Field of Classification Search
CPC ............... H05K 1/0296; H05K 1/0306; H05K 2201/10121; H05K 2201/10522
(Continued)

(56) References Cited

U.S. PATENT DOCUMENTS

| 6,608,334 B1 | 8/2003 | Ishinaga |
| 2003/0189830 A1 | 10/2003 | Sugimoto et al. |

(Continued)

FOREIGN PATENT DOCUMENTS

| JP | S62-4157 U | 1/1987 |
| JP | H6-77317 A | 3/1994 |

(Continued)

*Primary Examiner* — Sherman Ng
(74) *Attorney, Agent, or Firm* — Procopio Cory Hargreaves and Savitch LLP

(57) ABSTRACT

A multipiece element storage package of the present disclosure includes: a mother substrate which includes first element storage package regions, second element storage package regions, a dummy region, a first surface, and a second surface; a first stem electrode disposed in a part of the dummy region which part is in the first surface; and a second stem electrode disposed on the second surface. The first element storage package regions and the second element storage package regions each include a frame body disposed on the first surface, a first wiring conductor disposed on the first surface, and including one end located inside the frame body and the other end connected to the first stem electrode, and a second wiring conductor including one end which is located on the first surface and inside the frame body and the other end which is connected to the second stem electrode.

12 Claims, 8 Drawing Sheets

(58) Field of Classification Search
USPC .......................................................... 361/774
See application file for complete search history.

(56) References Cited

U.S. PATENT DOCUMENTS

| | | | |
|---|---|---|---|
| 2012/0248294 A1* | 10/2012 | Kohama | H01L 27/14625 250/214 P |
| 2013/0076458 A1* | 3/2013 | Katou | G03F 7/40 333/195 |
| 2015/0136454 A1* | 5/2015 | Ishihara | H05K 1/142 174/255 |
| 2015/0305160 A1* | 10/2015 | Funahashi | H01L 21/4857 348/374 |
| 2016/0007447 A1* | 1/2016 | Funahashi | H05K 1/0306 348/375 |
| 2016/0065170 A1* | 3/2016 | Takebayashi | H03H 9/131 331/158 |

FOREIGN PATENT DOCUMENTS

| | | | |
|---|---|---|---|
| JP | H9-148629 A | 6/1997 |
| JP | 2003-78170 A | 3/2003 |
| JP | 2006-156643 A | 6/2006 |
| WO | 01/43205 A1 | 6/2001 |
| WO | 02/084750 A1 | 10/2002 |

\* cited by examiner

MULTIPIECE ELEMENT STORAGE PACKAGE AND MULTIPIECE OPTICAL SEMICONDUCTOR DEVICE

CROSS-REFERENCE TO RELATED APPLICATIONS

This application is a national stage entry according to 35 U.S.C. 371 of International Application No. PCT/JP2019/005449 filed on Feb. 14, 2019, which claims priority to Japanese Patent Application No. 2018-025894 filed on Feb. 16, 2018, the contents of which are entirely incorporated herein by reference.

TECHNICAL FIELD

The present disclosure relates to a multipiece element storage package and a multipiece optical semiconductor device.

BACKGROUND

A semiconductor laser element (laser diode) can emit light which has the same wavelength and are in phase as compared with a light emitting diode element (light emitting diode). Therefore, the semiconductor laser element is considered to have an advantage over the light emitting diode element in the field of image display devices such as high-brightness display devices and scanning display devices.

In recent years, miniaturization of semiconductor laser elements has been promoted. Along with this, it is required to efficiently carry out aging on a large number of semiconductor laser elements and a large number of semiconductor laser devices each including the semiconductor laser element. For example, Japanese Unexamined Patent Publication JP-A 6-77317 (1994) (Patent Literature 1) describes that element characteristics are evaluated and aging or the like is carried out in a state where a large number of semiconductor laser elements are attached to a large-diameter sub-mount.

In the technique of the related art, in order to carry out aging on a semiconductor laser device including a semiconductor element, after the semiconductor laser element is mounted on an element storage package such as a TO-CAN type package to manufacture a semiconductor laser device, it is necessary to electrically connect the semiconductor laser device to an aging device. Therefore, when aging is carried out on a large number of semiconductor laser devices, a time loss may occur due to connection work between electrodes of a large number of semiconductor laser devices and terminals of the aging device, which may reduce productivity.

SUMMARY

A multipiece element storage package of an embodiment of the disclosure includes a mother substrate, a first stem electrode, and at least one second stem electrode. The mother substrate includes a plurality of first element storage package regions which are arranged along a first direction, a plurality of second element storage package regions which are arranged along the first direction and apart from the plurality of first element storage package regions in a second direction orthogonal to the first direction, a dummy region which is located between the plurality of first element storage package regions and the plurality of second element storage package regions, a first surface, and a second surface opposite to the first surface. The first stem electrode is disposed in a part of the dummy region, wherein the part of the dummy region is in the first surface and extends in the first direction. The at least one stem electrode is disposed on the second surface. The plurality of first element storage package regions and the plurality of second element storage package regions each include a frame body disposed on the first surface, a first wiring conductor disposed on the first surface, and including one first wiring conductor end located inside the frame body and another first wiring conductor end connected to the first stem electrode, and a second wiring conductor including one second wiring conductor end which is located on the first surface and inside the frame body, and another second wiring conductor end which is led to the second surface and is connected to the at least one second stem electrode.

Further, a multipiece element storage package of an embodiment of the disclosure includes a mother substrate, a lattice-shaped frame body, a first electrode pattern, and a second electrode pattern. The mother substrate includes a plurality of element storage package regions which are arranged in a matrix, the mother substrate including a first surface and a second surface opposite to the first surface. The lattice-shaped frame body includes a wall portion disposed on the first surface along a boundary of the plurality of element storage package regions. The first electrode pattern is disposed on a surface of the frame body, wherein the surface of the lattice-shaped frame body is opposite to the mother substrate. The second electrode pattern is disposed on the second surface. The plurality of element storage package regions each include a first wiring conductor including one first wiring conductor end which is located on the first surface and inside the frame body and another first wiring conductor end which is connected to the first electrode pattern, and a second wiring conductor including one second wiring conductor end which is located on the first surface and inside the frame body, and another second wiring conductor end which is led to the second surface and is connected to the second electrode pattern.

Moreover, a multipiece element storage package of an embodiment of the disclosure includes a mother substrate, at least one first stem electrode, and at least one second stem electrode. The mother substrate includes a plurality of element storage package regions which are arranged in a matrix, a first surface, and a second surface opposite to the first surface. The at least one first stem electrode is disposed on the second surface. The at least one second stem electrode is disposed on the second surface. The plurality of element storage package regions each include a frame body disposed on the first surface, a first wiring conductor including one first wiring conductor end which is located on the first surface and inside the frame body, and another first wiring conductor end which is led to the second surface and is connected to the at least one first stem electrode, and a second wiring conductor including one second wiring conductor end which is located on the first surface and inside the frame body, and another second wiring conductor end which is led to the second surface and is connected to the at least one second stem electrode.

A multipiece optical semiconductor device of an embodiment of the disclosure includes the multipiece element storage package described above and a plurality of optical semiconductor elements mounted in the multipiece element storage package.

BRIEF DESCRIPTION OF DRAWINGS

Objects, features, and advantages of the disclosure will be more apparent from the following detailed description and drawings.

DETAILED DESCRIPTION

Hereinafter, an example of an embodiment of a multipiece element storage package of the disclosure will be described with reference to the accompanying drawings.

Figure 1A:
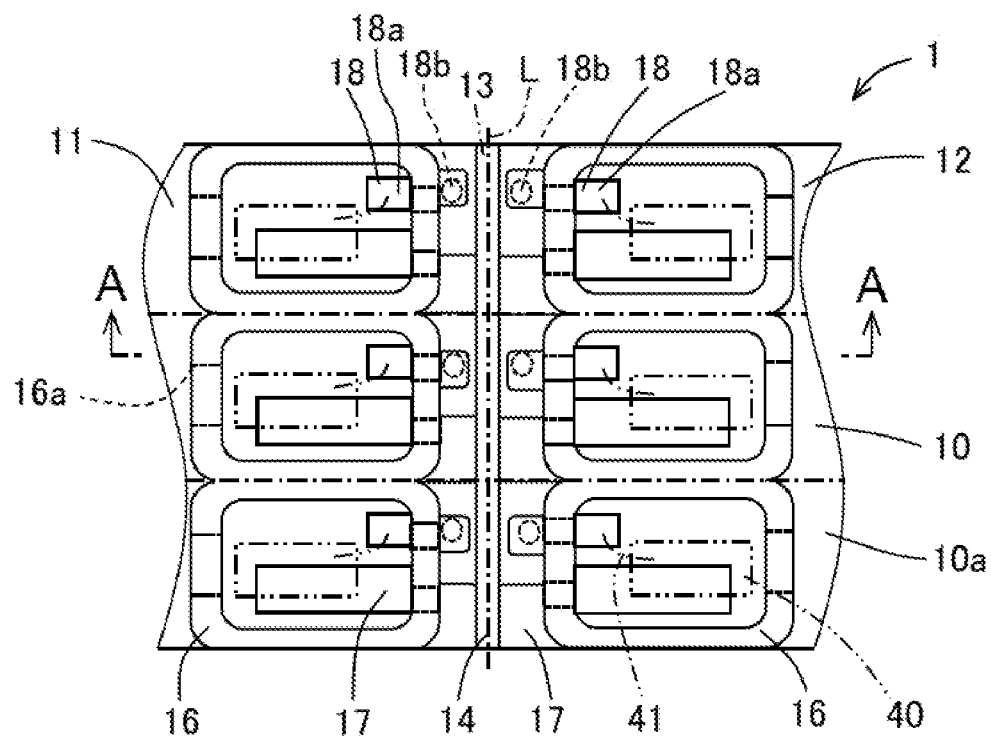
FIG. 1A is a plan view illustrating an example of an embodiment of a multipiece element storage package of the disclosure.
Figure 1B:
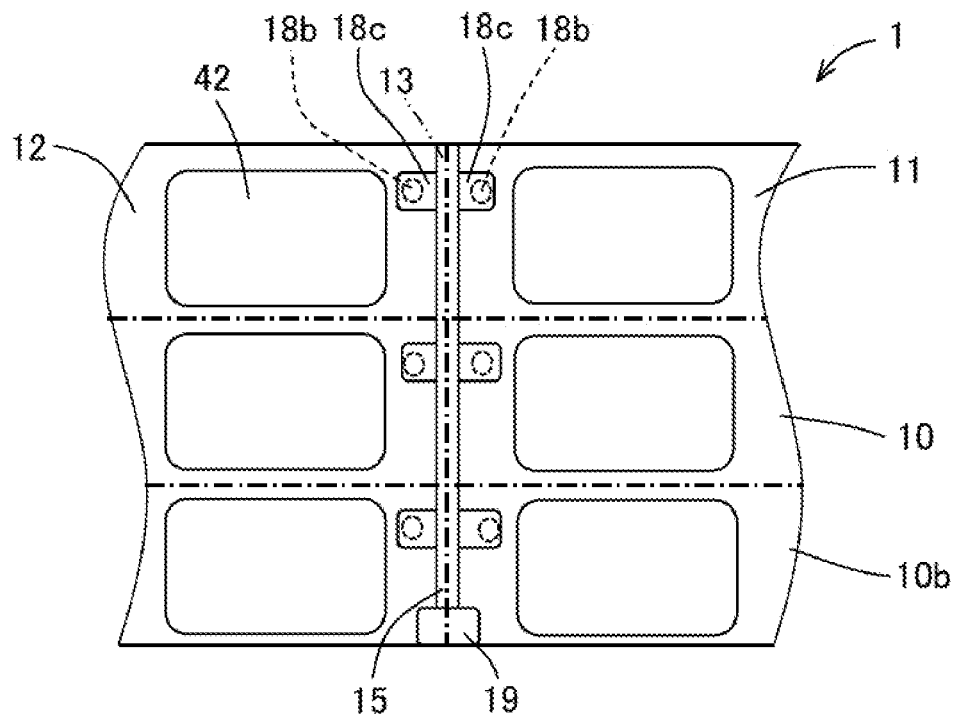
FIG. 1B is a plan view illustrating the example of the embodiment of the multipiece element storage package of the disclosure, as viewed from an opposite side of FIG. 1A.
Figure 2:
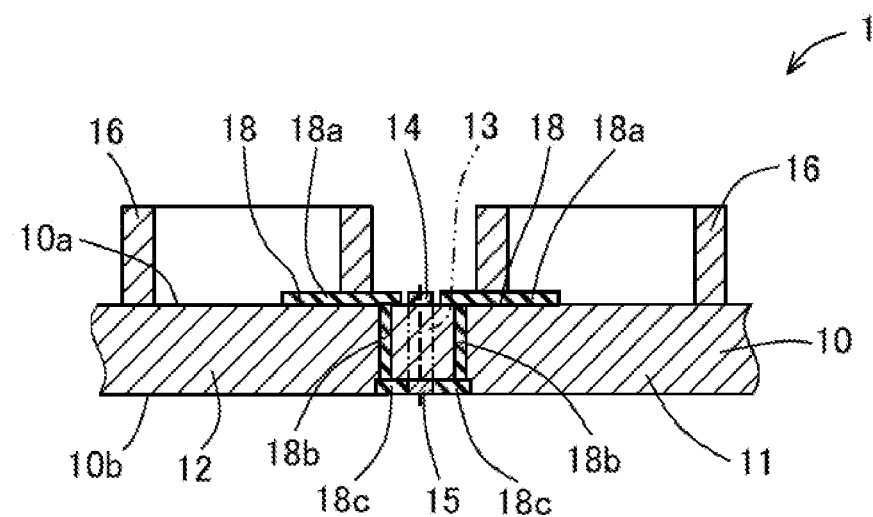
FIG. 2 is a cross-sectional view taken along the line A-A of FIG. 1A.

FIG. 1A is a plan view illustrating an example of the embodiment of the multipiece element storage package of the disclosure. FIG. 1B is a plan view illustrating the example of the embodiment of the multipiece element storage package of the disclosure, as viewed from an opposite side of FIG. 1A. FIG. 2 is a cross-sectional view taken along the line A-A of FIG. 1A.

A multipiece element storage package 1 of the present embodiment includes a mother substrate 10, a first stem electrode 14, and a second stem electrode 15.

The mother substrate 10 is an insulating substrate made of an electrically insulating material. The mother substrate 10 includes a first surface 10a and a second surface 10b opposite to the first surface 10a. The mother substrate 10 includes a plurality of first element storage package regions 11 arranged along a first direction (vertical direction in FIGS. 1A and 1B). Further, the mother substrate 10 includes a plurality of second element storage package regions 12 arranged along the first direction and apart from the first element storage package region 11 in a second direction (horizontal direction in FIGS. 1A and 1B) orthogonal to the first direction. Each first element storage package region 11 and each second element storage package region 12 have the same outer dimensions. Further, the same number of first element storage package regions 11 and second element storage package regions 12 are arranged. The mother substrate 10 further includes a dummy region 13 located between the first element storage package region 11 and the second element storage package region 12. The dummy region 13 is a region which connects the plurality of first element storage package regions 11 and the plurality of second element storage package regions 12.

The first stem electrode 14 is made of a conductive material. The first stem electrode 14 is disposed in the dummy region 13 on the first surface 10a and extends in the first direction. In the first direction, the first stem electrode 14 has a length equal to or longer than those of the plurality of first element storage package regions 11 and the plurality of second element storage package regions 12. Further, an electrode pad may be disposed at one end of the first stem electrode 14 in the first direction. This electrode pad may be used as an electrode pad for abutting a probe pin of an aging device when carrying out aging.

The second stem electrode 15 is made of a conductive material. The second stem electrode 15 is disposed in the dummy region 13 on the second surface 10b and extends in the first direction. In the first direction, the second stem electrode 15 has a length equal to or longer than those of the plurality of first element storage package regions 11 and the plurality of second element storage package regions 12. Further, as illustrated in FIG. 1B, an electrode pad 19 is provided at one end of the second stem electrode 15 in the first direction. The electrode pad 19 can be used as an electrode pad for abutting a probe pin when carrying out aging.

Each of the first element storage package regions 11 and each of the second element storage package regions 12 include a frame body 16, a first wiring conductor 17, and a second wiring conductor 18.

The frame body 16 is made of an electrically insulating material. The frame body 16 is disposed on the first surface 10a of the mother substrate 10. A region surrounded by the frame body 16 on the first surface 10a serves as the mounting region of the element. The frame body 16 surrounds a part of the first element storage package region 11 and the second element storage package region 12 which part is located on an outer side in the second direction thereof. The outer shape of the frame body 16 in a plan view may be, for example, a rectangular shape, a square shape, a circular shape, or any other shape. In the embodiment, as illustrated in FIG. 1A, the frame body 16 has a substantially rectangular outer shape in a plan view. The frame body 16 includes a side wall which forms one side of the substantially rectangular outer shape, and the side wall is provided with a through-hole 16a which penetrates the frame body 16. The through-hole 16a can be used as a light extraction port of an optical semiconductor device. The through-hole 16a may be sealed by a window member made of a translucent glass material. Further, the two frame bodies 16 adjacent to each other in the first direction may be integrated or may be separate bodies. In the embodiment, as illustrated in FIG. 1A, two frame bodies 16 adjacent to each other in the first direction are integrated.

The first wiring conductor 17 is made of a conductive material. The first wiring conductor 17 is disposed on the first surface 10a. The first wiring conductor 17 includes one end located inside the frame body 16 and the other end connected to the first stem electrode 14. The first wiring conductor 17 generally extends in the second direction. The first wiring conductor 17 may have a constant width. For example, as illustrated in FIG. 1A, the portion located outside the frame body 16 may have a width larger than that of the portion located inside the frame body 16.

The second wiring conductor 18 is made of a conductive material. The second wiring conductor 18 is disposed from the first surface 10a to the second surface 10b. The second wiring conductor 18 includes a first plane conductor portion 18a, a penetrating portion 18b, and a second plane conductor portion 18c. The first plane conductor portion 18a is disposed on the first surface 10a and extends in the second direction. The first plane conductor portion 18a includes one end located inside the frame body 16 and the other end located outside the frame body 16. The penetrating portion 18b penetrates the mother substrate 10 in a thickness direction thereof and one end on the first surface 10a side is connected to the first plane conductor portion 18a. The second plane conductor portion 18c is disposed on the second surface 10b and extends in the second direction. The second plane conductor portion 18c includes one end connected to the penetrating portion 18b and the other end connected to the second stem electrode 15.

Each of the first element storage package regions 11 and each of the second element storage package regions 12 may include a conductor layer 42 provided on the second surface 10b so as to be separated from the second plane conductor portion 18c. The conductor layer 42 may be provided so as to overlap the mounting region of the optical semiconductor element surrounded by the frame body 16 in a plan view. By providing the conductor layer 42, the optical semiconductor device manufactured from the multipiece element storage package 1 can be firmly bonded to the external substrate. The conductor layer 42 may be connected to the ground potential. As a result, it is possible to suppress noise from being mixed in the drive signal of the element. Further, by providing the conductor layer 42, it is possible to efficiently dissipate the heat generated when the element is driven to the outside.

In the multipiece element storage package 1 of the embodiment, as illustrated in FIGS. 1A and 1B, the plurality of first element storage package regions 11 and the plurality of second element storage package regions 12 are line-symmetric with respect to an imaginary line L which passes through the dummy region 13 and extends in the first direction. Thereby, the frame body 16, the first wiring conductor 17, and the second wiring conductor 18 can be easily formed.

The mother substrate 10 and the frame body 16 are made of an insulating material which is a ceramic material, for example, ceramics such as aluminum nitride (AlN) and alumina ($Al_2O_3$) or glass-ceramics. The mother substrate 10 and the frame body 16 may be integrally manufactured using an insulating material. The mother substrate 10 and the frame body 16 may be manufactured by laminating a plurality of insulating layers made of an insulating material. When the mother substrate 10 and the frame body 16 are integrally manufactured, for example, the mother substrate 10 and the frame body 16 can be manufactured by a molding method using a thermoplastic ceramic sheet and a mold member. The first stem electrode 14, the second stem electrode 15, the first wiring conductor 17, and the second wiring conductor 18 are made of, for example, a sintered body of metal powder such as tungsten, molybdenum, copper, silver, or silver palladium.

The multipiece element storage package 1 can be formed into a multipiece optical semiconductor device by mounting an optical semiconductor element 40 in each first element storage package region 11 and each second element storage package region 12. As the optical semiconductor element 40, for example, an edge emitting semiconductor laser element can be used. The optical semiconductor element 40 is mounted such that a light emitting surface of the optical semiconductor element 40 faces the through-hole 16a formed in the frame body 16. In the optical semiconductor element 40, for example, one electrode may be connected to the first wiring conductor 17 via a conductive bonding material such as solder and the other electrode may be connected to the second wiring conductor 18 via a bonding wire 41. As a result, the optical semiconductor device 40 can be mounted on each first element storage package region 11 and each second element storage package region. Further, in the multipiece optical semiconductor device, a lid body made of, for example, a metal material may be attached to a surface of the frame body 16, which is opposite to the mother substrate 10. The lid body may be attached before aging or may be attached after aging.

The multipiece optical semiconductor device including the above configuration is equivalent to an optical semiconductor device array in which a large number of optical semiconductor devices are connected in parallel. Therefore, it is possible to collectively carry out aging on a large number of regions, each of which serves as an individual optical semiconductor device. For example, aging can be carried out as follows. First, there is prepared an aging device including a large number of photodiodes capable of receiving light emitted from a large number of regions, each of which serves as an individual optical semiconductor device, a probe pin capable of abutting on the first stem electrode 14, and a probe pin capable of abutting on the electrode pad 19 connected to the second stem electrode 15. Next, the aging device is connected to the multipiece optical semiconductor device in a state where each photodiode can receive light from a large number of regions, each of which serves as an individual optical semiconductor device. Then, the probe pins are caused to abut on the first stem electrode 14 and the electrode pad 19, and the multipiece optical semiconductor device is energized. This makes it possible to collectively carry out aging on a large number of regions, each of which serves as an individual optical semiconductor device. Therefore, according to the multipiece optical semiconductor device equipped with the multipiece element storage package 1, it is possible to reduce the time loss associated with individually connecting a large number of optical semiconductor devices to the aging device. As a result, the productivity can be improved. The aging may be carried out in a dry air atmosphere. The aging may be carried out before sealing each first element storage package region 11 and each second element storage package region 12.

In addition, after aging is carried out, a large number of optical semiconductor devices can be manufactured by dividing the multipiece optical semiconductor device equipped with multipiece element storage package 1 into individual pieces along a planned dividing line (dash-dotted line) shown in FIGS. 1A and 1B. Individualization of the multipiece optical semiconductor device can be carried out by, for example, dicing processing using laser light. In the multipiece optical semiconductor device equipped with the multipiece element storage package 1, when individualizing, the dummy region 13 and the first stem electrode 14 and the second stem electrode 15 disposed in the dummy region 13 can be removed together. Further, the portions of the first wiring conductor 17 and the second plane conductor portion 18c of the second wiring conductor 18 located outside the frame body 16 can be used as electrode pads for driving the optical semiconductor device. Thus, the multipiece optical semiconductor device equipped with the multipiece element storage package 1 does not need to undergo processing such as removal of unnecessary electrodes and formation of electrode pads necessary for driving the optical semiconductor device after individualization. As a result, the productivity can be improved. Further, in the multipiece optical semiconductor device equipped with the multipiece element storage package 1, since the probe pins of the aging device do not abut on the first wiring conductor 17 and the second wiring conductor 18, occurrence of defects due to aging can be suppressed. As a result, the productivity can be improved.

As described above, according to the multipiece element storage package 1 of the embodiment, time loss during aging can be reduced, and thus the productivity can be improved.

Figure 3A:
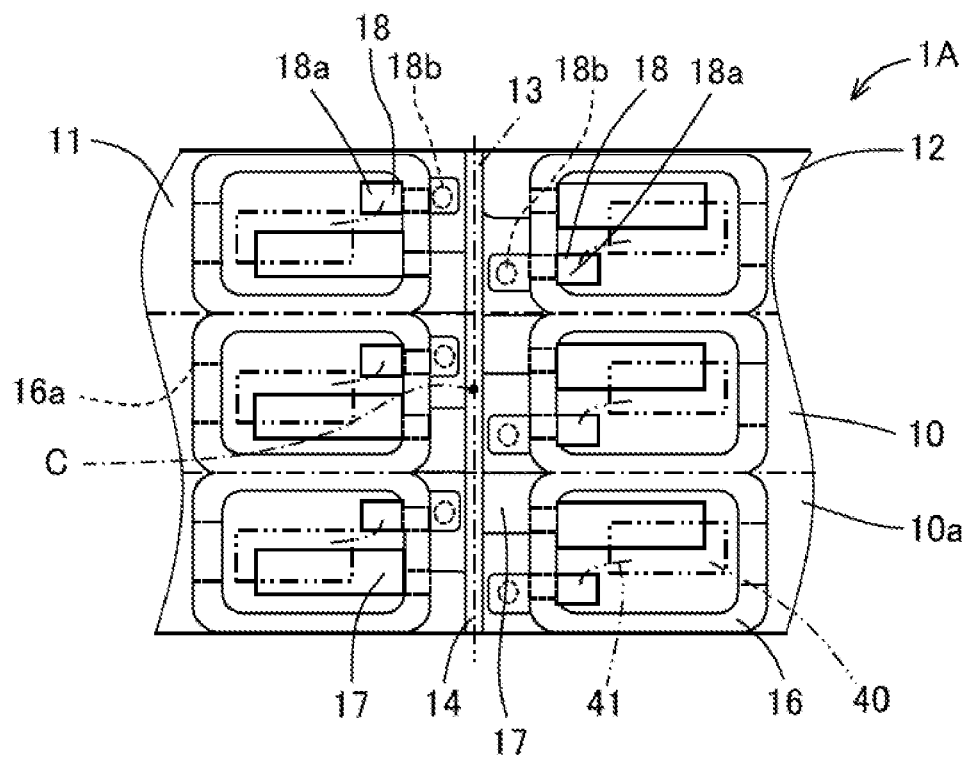
FIG. 3A is a plan view illustrating another example of the embodiment of the multipiece element storage package of the disclosure.
Figure 3B:
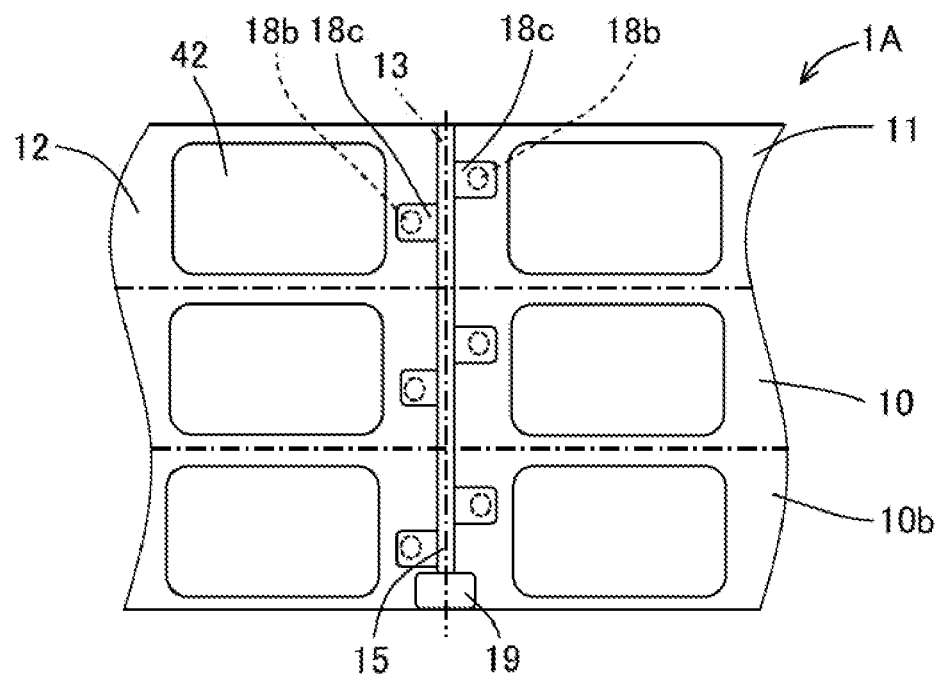
FIG. 3B is a plan view illustrating another example of the embodiment of the multipiece element storage package, as viewed from an opposite side of FIG. 3A.

FIG. 3A is a plan view illustrating another example of the embodiment of the multipiece element storage package of the disclosure. FIG. 3B is a plan view illustrating another example of the embodiment of the multipiece element storage package of the disclosure, as viewed from an opposite side of FIG. 3A.

Compared with the multipiece element storage package 1, a multipiece element storage package 1A of the embodiment is different in the configurations of the first wiring conductor and the second wiring conductor, and the other configurations are the same. Therefore, the same components are denoted by the same reference signs as those of the multipiece element storage package 1, and detailed description thereof is omitted.

In the multipiece element storage package 1A of the embodiment, as illustrated in FIGS. 3A and 3B, in a plan view, the plurality of first element storage package regions 11 and the plurality of second element storage package regions 12 are configured in point symmetry with respect to a centroid C of a region including the plurality of first element storage package regions 11, the plurality of second element storage package regions 12, and the dummy region 13.

Like the multipiece element storage package 1, the multipiece element storage package 1A of the embodiment can reduce the time loss associated with individually connecting a large number of optical semiconductor devices to the aging device, and thus the productivity can be improved. Moreover, according to the multipiece element storage package 1A of the embodiment, a large number of optical semiconductor devices including the same configuration can be manufactured.

Figure 4A:
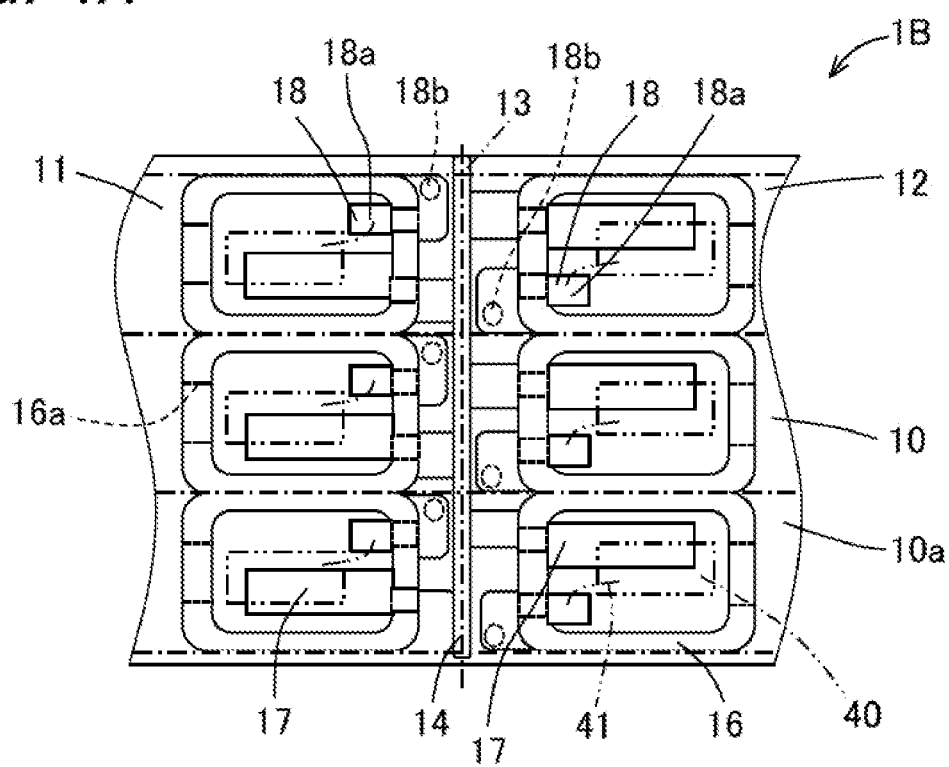
FIG. 4A is a plan view illustrating another example of the embodiment of the multipiece element storage package of the disclosure.
Figure 4B:
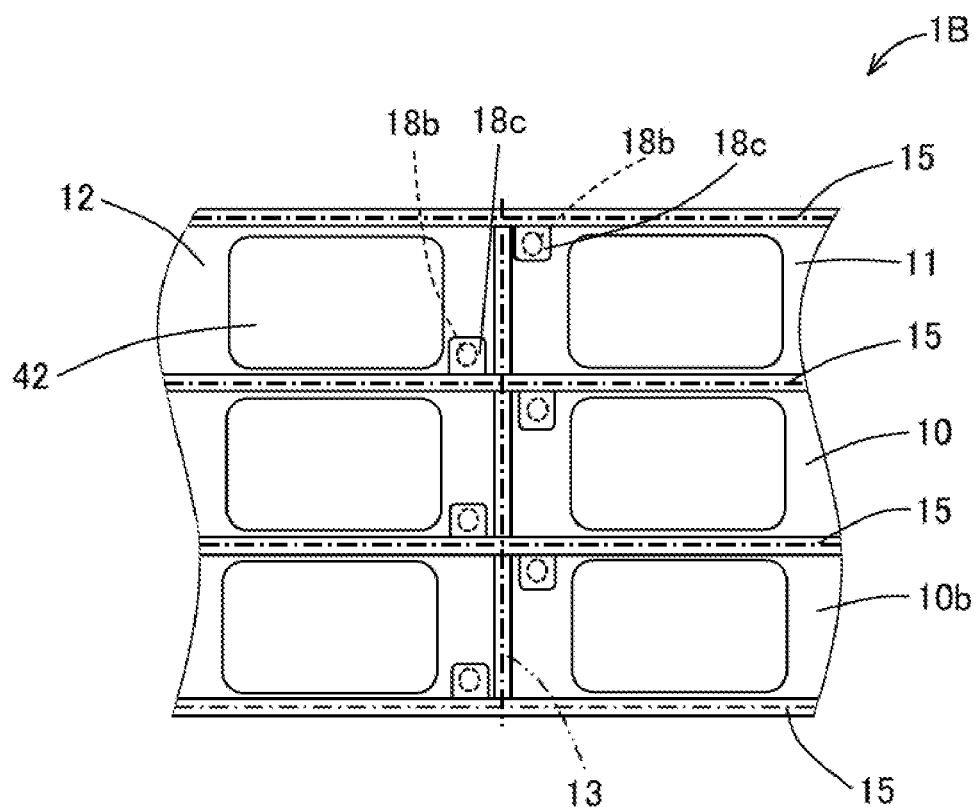
FIG. 4B is a plan view illustrating another example of the embodiment of the multipiece element storage package of the disclosure, as viewed from an opposite side of FIG. 4A.

FIG. 4A is a plan view illustrating another example of the embodiment of the multipiece element storage package of the disclosure. FIG. 4B is a plan view illustrating another example of the embodiment of the multipiece element storage package of the disclosure, as viewed from an opposite side of FIG. 4A.

Compared with the multipiece element storage package 1A, a multipiece element storage package 1B of the embodiment is different in the configuration of the second stem electrode and the other configurations are the same. Therefore, the same components are denoted by the same reference signs as those of the multipiece element storage package 1A, and the detailed description thereof is omitted.

The multipiece element storage package 1B of the embodiment includes the plurality of second stem electrodes 15 arranged on the second surface 10b of the mother substrate 10. As illustrated in FIG. 4B, the second stem electrode 15 extends in a second direction (horizontal direction in FIG. 4B) along the boundary of the first element storage package region 11. The second stem electrode 15 extends in the second direction along the boundary of the second element storage package region 12. The second stem electrode 15 may be disposed in the dummy region 13 or may not be disposed in the dummy region 13. In the embodiment, as illustrated in FIG. 4B, the second stem electrode 15 is disposed in the dummy region 13 and extends linearly across the dummy region. The second stem electrode 15 can be used as a marker when dicing the multipiece element storage package 1B along the second direction.

The plurality of second stem electrodes 15 may be connected to each other by a wiring conductor disposed in a region of the second surface 10b other than the first element storage package region 11 and the second element storage package region 12. The wiring conductor may be provided with an electrode pad for abutting the probe pin of the aging device.

Like the multipiece element storage package 1A, the multipiece element storage package 1B of the embodiment can reduce the time loss associated with individually connecting a large number of optical semiconductor devices to the aging device, and thus the productivity can be improved and it becomes possible to manufacture a large number of optical semiconductor devices including the same configuration. Further, the multipiece element storage package 1B of the embodiment can be used as a marker when the second stem electrode 15 is used for dicing processing. For this reason, it is possible to accurately carry our individualization, suppress the occurrence of defects due to the dicing processing, and improve the productivity.

Figure 5A:
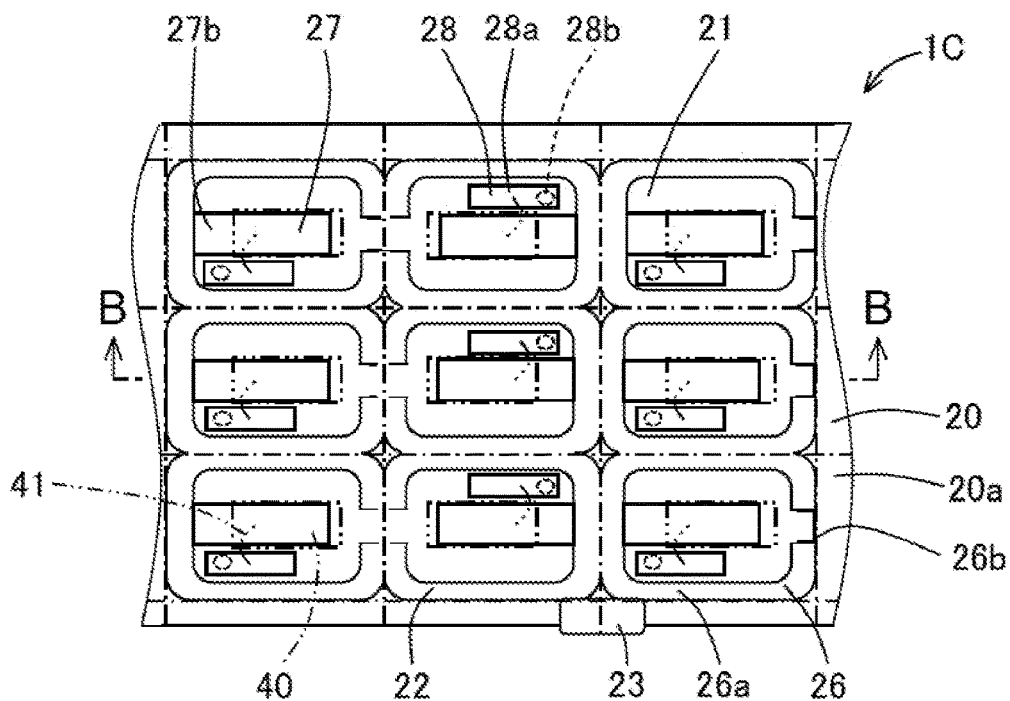
FIG. 5A is a plan view illustrating another example of the embodiment of the multipiece element storage package of the disclosure.
Figure 5B:
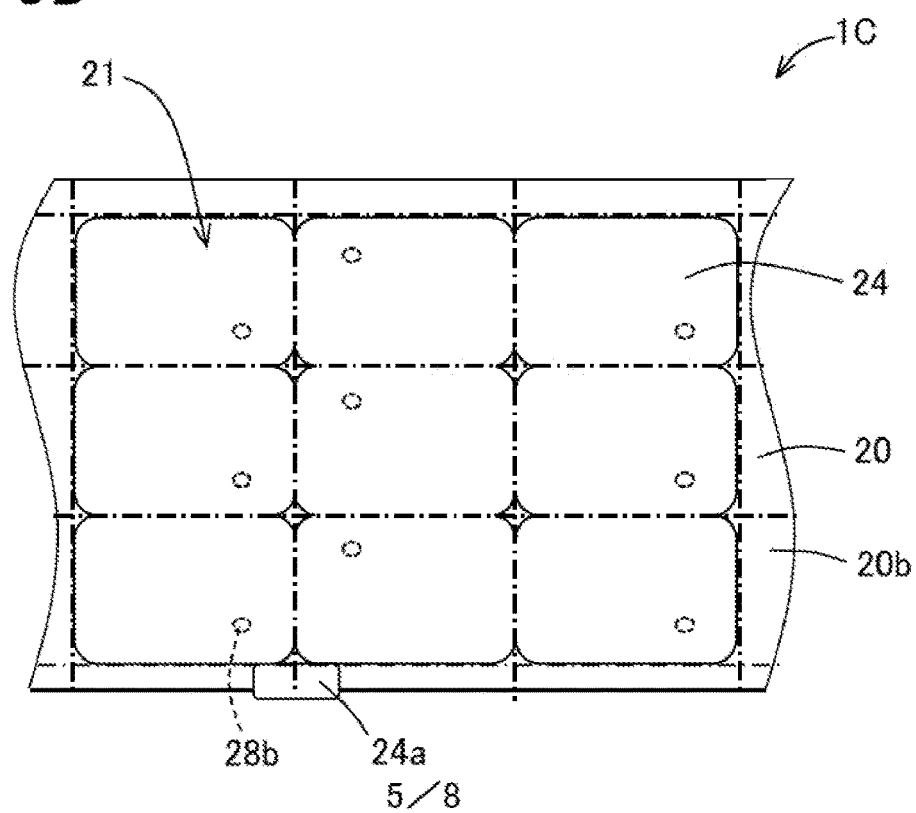
FIG. 5B is a plan view illustrating another example of the embodiment of the multipiece element storage package of the disclosure, as viewed from an opposite side of FIG. 5A.
Figure 6:
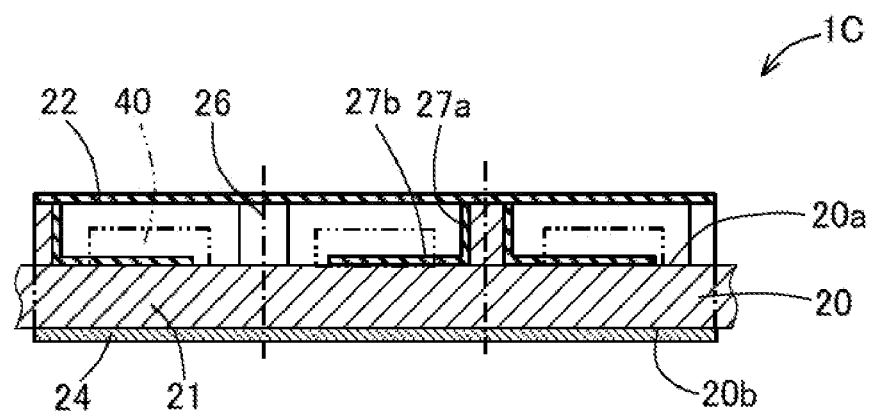
FIG. 6 is a cross-sectional view taken along the line B-B of FIG. 5A.

FIG. 5A is a plan view illustrating another example of the embodiment of the multipiece element storage package of the disclosure. FIG. 5B is a plan view illustrating another example of the embodiment of the multipiece element storage package of the disclosure, as viewed from an opposite side of FIG. 5A. FIG. 6 is a cross-sectional view taken along the line B-B of FIG. 5A. A multipiece element storage package 1C of the embodiment includes a mother substrate 20, a frame body 26, a first electrode pattern 22, and a second electrode pattern 24.

The mother substrate 20 includes a first surface 20a and the second surface 20b opposite to the first surface 20a. The mother substrate 20 includes a plurality of element storage package regions 21 arranged in a matrix. In a plan view, the plurality of element storage package regions 21 are arranged in a matrix in a first direction (vertical direction in FIGS. 5A and 5B) and a second direction (horizontal direction in FIGS. 5A and 5B) orthogonal to the first direction.

The frame body 26 is made of an electrically insulating material. The frame body 26 is disposed on the first surface 20a of the mother substrate 20. The frame body 26 has a lattice shape and includes a wall portion 26a disposed along a boundary of the plurality of element storage package regions 21.

The frame body 26 includes a plurality of notch portions 26b. The notch portions 26b are provided by cutting out a part or the whole of a plurality of places of the wall portion 26a in the height direction (direction perpendicular to the paper surface in FIG. 5A). In the embodiment, as illustrated in FIG. 5A, the notch portions 26b are formed in every other row of the wall portions 26a arranged in rows and across two element storage package regions 21 adjacent to each other in the second direction. Further, in the embodiment, the notch portion 26b is formed by cutting out from the surface of the wall portion 26a close to the mother substrate 20 to the surface of the wall portion 26a opposite to the mother substrate 20. The notch portion 26b can be used as a light extraction port of the optical semiconductor device. The notch portion 26b may be sealed by a window member made of a translucent glass material.

The first electrode pattern 22 is made of a conductive material. The first electrode pattern 22 is disposed on the surface of the frame body 26 opposite to the mother substrate 20. In the embodiment, the first electrode pattern 22 is formed on the entire surface of the frame body 26 opposite to the mother substrate 20. Further, the first electrode pattern 22 is electrically connected to a first electrode pad 23 disposed outside the frame body 26 on the first surface 20a. The first electrode pattern 22 and the first electrode pad 23 may be disposed, for example, on the outer wall surface of the frame body 26 and may be connected by a wiring conductor extending in the height direction of the outer wall surface. The first electrode pattern 22 and the first electrode pad 23 may be connected by a bonding wire. The first electrode pad 23 is an electrode pad for abutting the probe pin of the aging device.

The second electrode pattern 24 is made of a conductive material. The second electrode pattern 24 is provided on the second surface 20b of the mother substrate 20 so as to cover the plurality of element storage package regions 21. Further, a second electrode pad 25 electrically connected to the second electrode pattern 24 is disposed in a region other than the element storage package region 21 on the second surface 20b of the mother substrate 20. The second electrode pad 25 is an electrode pad for abutting the probe pin of the aging device.

Each element storage package region 21 includes a first wiring conductor 27 and a second wiring conductor 28.

The first wiring conductor 27 includes one end which is located on the second surface 20b and inside the frame body 26, and the other end which is connected to the first electrode pattern 22. The first wiring conductor 27 includes a wall surface conductor portion 27a and a plane conductor portion 27b. The wall surface conductor portion 27a is disposed on the inner wall surface of the frame body 26 and extends in the height direction. The wall surface conductor portion 27a is connected to the first electrode pattern 22. The plane conductor portion 27b is disposed on the first surface 20a and is connected to the wall surface conductor portion 27a.

The second wiring conductor 28 is disposed from the first surface 20a to the second surface 20b. The second wiring conductor 28 includes a plane conductor portion 28a and a through conductor portion 28b. The plane conductor portion 28a is disposed on the first surface 20a. The through conductor portion 28b penetrates the mother substrate 20 in a thickness direction thereof and includes one end connected to the plane conductor portion 28a, and the other end connected to the second electrode pattern 24.

The mother substrate 20 and the frame body 26 are made of an insulating material which is a ceramic material, for example, ceramics such as aluminum nitride (AlN) and alumina ($Al_2O_3$) or glass-ceramics. The mother substrate 20 and the frame body 26 may be integrally manufactured using an insulating material. The mother substrate 20 and the frame body 26 may be manufactured by laminating a plurality of insulating layers made of an insulating material. When the mother substrate 20 and the frame body 26 are integrally manufactured, for example, the mother substrate 20 and the frame body 26 can be manufactured by a molding method using a thermoplastic ceramic sheet and a mold member. The first electrode pattern 22, the second electrode pattern 24, the first wiring conductor 27, and the second wiring conductor 28 are made of, for example, a sintered body of metal powder such as tungsten, molybdenum, copper, silver, or silver palladium.

The multipiece element storage package 1C can be formed into a multipiece optical semiconductor device by mounting the optical semiconductor element 40 in each element storage package region 21. As the optical semiconductor element 40, for example, an edge emitting semiconductor laser element can be used. The optical semiconductor element 40 is mounted such that the light emitting surface of the optical semiconductor element 40 faces the notch portion 26b formed in the frame body 26. In the optical semiconductor element 40, for example, one electrode is electrically connected to the first wiring conductor 27 via a conductive bonding material such as solder and the other electrode is electrically connected to the second wiring conductor 28 via a bonding wire 41. Thereby, the optical semiconductor element 40 may be mounted in each element storage package region 21. Further, in the multipiece optical semiconductor device, a lid body made of, for example, a metal material may be attached to the surface of the frame body 26 opposite to the mother substrate 20. The lid body may be attached before aging or may be attached after aging.

The multipiece optical semiconductor device including the above configuration is equivalent to an optical semiconductor device array in which a large number of optical semiconductor devices are connected in parallel. Therefore, aging can be collectively carried out on a large number of regions, each of which serves as an individual optical semiconductor device. For example, aging can be carried out as follows. First, there is prepared an aging device including a large number of photodiodes capable of receiving light emitted from a large number of regions, each of which serves as an individual optical semiconductor device, a probe pin capable of abutting on the first electrode pad 23, and a probe pin capable of abutting on the second electrode pad 25. Next, this aging device is connected to the multipiece optical semiconductor device in a state where each photodiode can receive light from a large number of regions, each of which serves as an individual optical semiconductor device. Then, the probe pins are caused to abut on the first electrode pad 23 and the second electrode pad 25, and the multipiece optical semiconductor device is energized. This makes it possible to collectively carry out aging on a large number of regions, each of which serves as an individual optical semiconductor device. Therefore, according to the multipiece optical semiconductor device equipped with the multipiece element storage package 1C, time loss associated with individually connecting a large number of optical semiconductor devices to an aging device can be reduced, and thus the productivity can be improved. The aging may be carried out in a dry air atmosphere. The aging may be carried out before sealing each element storage package region 21.

In addition, after aging is carried out, a large number of optical semiconductor devices can be manufactured by dividing the multipiece optical semiconductor device equipped with the multipiece element storage package 1C into individual pieces along the planned dividing line (dash-dotted line) shown in FIGS. 5A, 5B, and 6. Individualization of the multipiece optical semiconductor device can be carried out by, for example, dicing processing using laser light. In the multipiece optical semiconductor device equipped with the multipiece element storage package 1C, the first electrode pattern 22 and the second electrode pattern 24 can be used as electrode pads for driving an optical semiconductor device obtained by dividing the multipiece optical semiconductor device into individual pieces. Thus, the multipiece optical semiconductor device equipped with the multipiece element storage package 1C does not need to undergo processing such as removal of unnecessary electrodes and formation of electrode pads necessary for driving the optical semiconductor device after individualization, and thus the productivity can be improved. In addition, in the multipiece optical semiconductor device equipped with the multipiece element storage package 1C, the probe pins of the aging device do not abut on the first electrode pattern 22 and the second electrode pattern 24. Therefore, occurrence of defects due to aging can be suppressed and the productivity can be improved.

As described above, according to the multipiece element storage package 1C of the embodiment, it is possible to reduce time loss during aging and improve productivity. Moreover, the multipiece element storage package 1C does not include a dummy region. Therefore, the element storage package regions 21 can be arranged at high density, and thus the productivity can be improved.

Figure 7A:
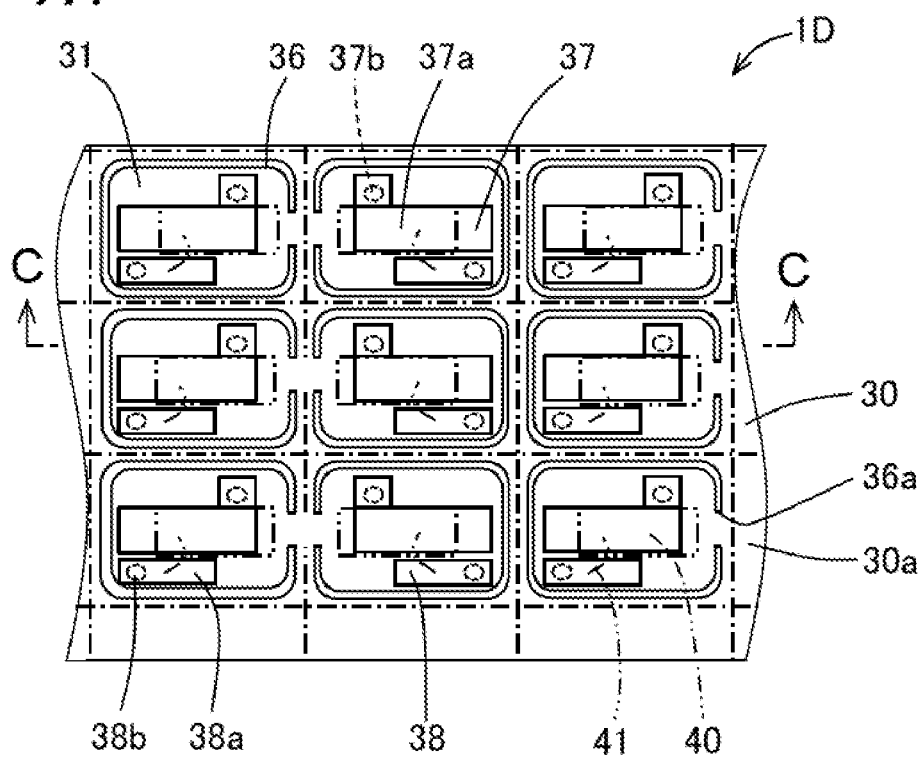
FIG. 7A is a plan view illustrating another example of the embodiment of the multipiece element storage package of the disclosure.
Figure 7B:
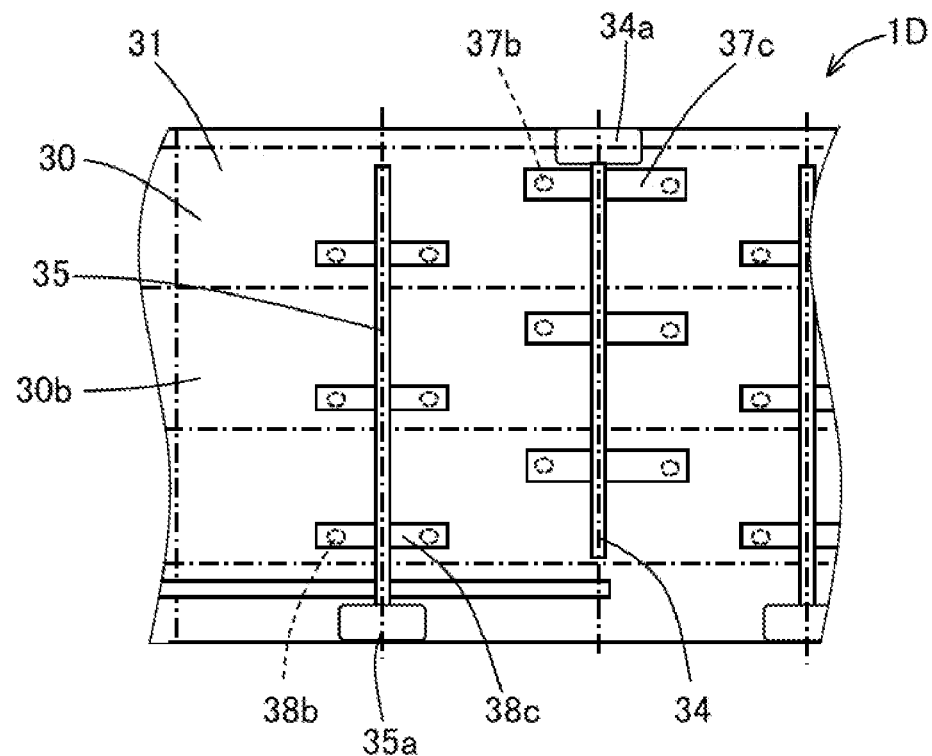
FIG. 7B is a plan view illustrating another example of the embodiment of the multipiece element storage package of the disclosure, as viewed from an opposite side of FIG. 7A.
Figure 8:
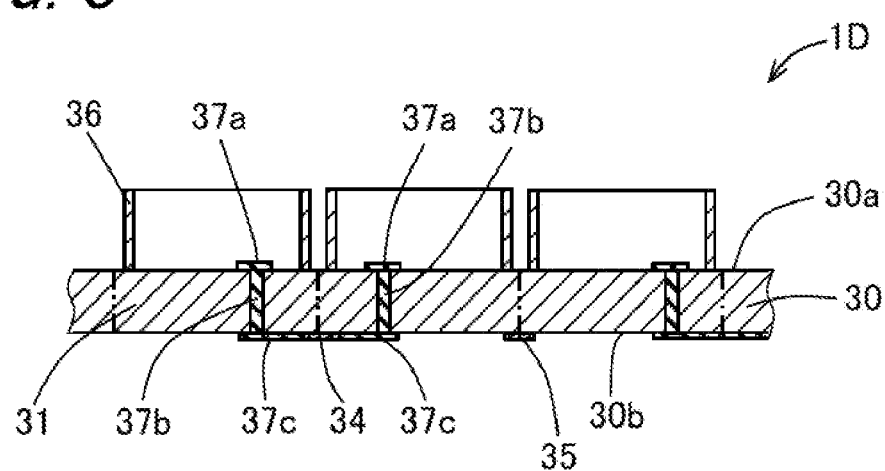
FIG. 8 is a cross-sectional view taken along the line C-C in FIG. 7A.

FIG. 7A is a plan view illustrating another example of the embodiment of the multipiece element storage package of the disclosure. FIG. 7B is a plan view illustrating the other example of the embodiment of the multipiece element storage package of the disclosure, as viewed from an opposite side of FIG. 7A. FIG. 8 is a cross-sectional view taken along the line C-C in FIG. 7A.

A multipiece element storage package 1D of the embodiment includes a mother substrate 30, a first stem electrode 34, and a second stem electrode 35.

The mother substrate 30 includes a first surface 30a and a second surface 30b opposite to the first surface 30a. The mother substrate 30 includes a plurality of element storage package regions 31 arranged in a matix. The plurality of element storage package regions 31 are arranged in a matrix in a first direction (vertical direction in FIGS. 7A and 7B) and a second direction (horizontal direction in FIGS. 7A and 7B) orthogonal to the first direction in a plan view.

The first stem electrode 34 and the second stem electrode 35 are disposed on the second surface 30b of the mother substrate 30. The first stem electrode 34 and the second stem electrode 35 are disposed along a boundary of an element storage package region 31. Although FIG. 7B illustrates an example in which both the first stem electrode 34 and the second stem electrode 35 extend in the first direction, both the first stem electrode 34 and the second stem electrode 35 may extend in the second direction and the first stem electrode 34 and the second stem electrode 35 may extend in different directions. When a plurality of first stem electrodes 34 or a plurality of second stem electrodes 35 are provided, an electrode for connecting the plurality of first stem electrodes 34 or the plurality of second stem electrodes 35 may be disposed on the second surface 30b.

In the embodiment, a first electrode pad 34a is provided at one end of the first stem electrode 34 in the first direction and a second electrode pad 35a is provided at one end of the second stem electrode 35 in the first direction. The first electrode pad 34a and the second electrode pad 35a are disposed in a region other than the element storage package region 31 on the second surface 30b. The first electrode pad 34a and the second electrode pad 35a are electrode pads for abutting the probe pins of the aging device.

Each element storage package region 31 includes a frame body 36, a first wiring conductor 37, and a second wiring conductor 38.

The frame body 36 is disposed on the first surface 30a and the region surrounded by the frame body 36 on the first surface 30a serves as the mounting region of the optical semiconductor element. The outer shape of the frame body 36 in a plan view may be, for example, a rectangular shape, a square shape, a circular shape, or any other shape. In the embodiment, as illustrated in FIG. 7A, the frame body 36 has a substantially rectangular outer shape. Although FIG. 7A illustrates an example in which two adjacent frame bodies 36 are separated from each other, the two adjacent frame bodies 36 may be integrated with each other.

The frame body 36 includes a notch portion 36a provided by cutting out a part of the frame body 36. The notch portion 36a is provided by cutting out a part or the whole of a part of the frame body 36 in the height direction (direction perpendicular to the paper surface in FIG. 7A). In the embodiment, the notch portion 36a is formed by cutting out from the surface of the frame body 36 close to the mother substrate 30 to the surface of the frame body 36 opposite to the mother substrate 30. The notch portion 36a can be used as a light extraction port of an optical semiconductor device. The notch portion 36a may be sealed by a window member made of a translucent glass material.

The first wiring conductor 37 is disposed so as to extend from the first surface 30a to the second surface 30b. The first wiring conductor 37 includes one end which is located on the first surface 30a and inside the frame body 36, and the other end which is led to the second surface 30b and is connected to the first stem electrode 34. In the embodiment, as illustrated in FIGS. 7A and 7B, the first wiring conductor 37 includes a first plane conductor portion 37a, a first through conductor portion 37b, and a second plane conductor portion 37c. The first plane conductor portion 37a is located on the first surface 30a and inside the frame body 36. The first through conductor portion 37b penetrates the mother substrate 30 in a thickness direction thereof and includes one end connected to the first plane conductor portion 37a. The second plane conductor portion 37c is disposed on the second surface 30b, and includes one end connected to the first through conductor portion 37b, and the other end connected to the first stem electrode 34.

The second wiring conductor 38 is disposed so as to extend from the first surface 30a to the second surface 30b. The second wiring conductor 38 includes one end which is located on the first surface 30a and inside the frame body 36, and the other end which is led to the second surface 30b and is connected to the second stem electrode 35. In the embodiment, as illustrated in FIGS. 7A and 7B, the second wiring conductor 38 includes a third plane conductor portion 38a, a second through conductor portion 38b, and a fourth plane conductor portion 38c. The third plane conductor portion 38a is located on the first surface 30a and inside the frame body 36. The second through conductor portion 38b penetrates the mother substrate 30 in the thickness direction and includes one end connected to the third plane conductor portion 38a. The fourth plane conductor portion 38c is disposed on the second surface 30b, and includes one end connected to the second through conductor portion 38b, and the other end connected to the second stem electrode 35.

The mother substrate 30 and the frame body 36 are made of an insulating material which is a ceramic material, for example, ceramics such as aluminum nitride (AlN) and alumina ($Al_2O_3$) or glass-ceramics. The mother substrate 30 and the frame body 36 may be integrally manufactured using an insulating material. The mother substrate 30 and the frame body 36 may be manufactured by laminating a plurality of insulating layers made of an insulating material. When the mother substrate 30 and the frame body 36 are integrally manufactured, for example, the mother substrate 30 and the frame body 36 can be manufactured by a molding method using a thermoplastic ceramic sheet and a mold member. The first stem electrode 34, the second stem electrode 35, the first wiring conductor 37, and the second wiring conductor 38 are made of, for example, a sintered body of metal powder such as tungsten, molybdenum, copper, silver, or silver palladium.

The multipiece element storage package 1D can be formed into a multipiece optical semiconductor device by mounting the optical semiconductor element 40 in each element storage package region 31. As the optical semiconductor element 40, for example, an edge emitting semiconductor laser element can be used. The optical semiconductor element 40 is mounted such that the light emitting surface of the optical semiconductor element 40 faces the notch portion 36a formed in the frame body 36. In the optical semiconductor element 40, for example, one electrode is electrically connected to the first plane conductor portion 37a of the first wiring conductor 37 via a conductive bonding material such as solder and the other electrode is electrically connected to the third plane conductor portion 38a of the second wiring conductor 38 via the bonding wire 41. Thereby, the optical semiconductor element 40 may be mounted in each element storage package region 31. Further, in the multipiece optical semiconductor device, a lid body made of, for example, a metal material may be attached to the surface of the frame body 36 opposite to the mother substrate 30. The lid body may be attached before carrying out aging or may be attached after carrying out aging.

The multipiece optical semiconductor device including the above configuration is equivalent to an optical semiconductor device array in which a large number of optical semiconductor devices are connected in parallel. Therefore, before dividing the multipiece optical semiconductor device into individual pieces, it is possible to collectively carry out aging on a large number of regions, each of which serves as an individual optical semiconductor device. For example, aging can be carried out as follows. First, there is prepared an aging device including a large number of photodiodes capable of receiving light emitted from a large number of regions, each of which serves as an individual optical semiconductor device, a probe pin capable of abutting on the first electrode pad 34a, and a probe pin capable of abutting on the second electrode pad 35a. Next, the aging device is connected to the multipiece optical semiconductor device in a state where each photodiode can receive light from a large number of regions, each of which serves as an individual optical semiconductor device. After that, the probe pins are caused to abut the first electrode pad 34a and the second electrode pad 35a, and the multipiece optical semiconductor device is energized. This makes it possible to collectively carry out aging on a large number of regions, each of which serves as an individual optical semiconductor device. Therefore, according to the multipiece optical semiconductor device equipped with the multipiece element storage package 1D, it is possible to reduce the time loss associated with individually connecting a large number of optical semiconductor devices to the aging device, and thus the productivity can be improved. The aging may be carried out in a dry air atmosphere. The aging may be carried out before sealing each element storage package region 31.

In addition, after the aging is carried out, a large number of optical semiconductor devices can be manufactured by dividing the multipiece optical semiconductor device equipped with the multipiece element storage package 1D into individual pieces along the planned dividing line (dash-dotted line) shown in FIGS. 7A, 7B, and 8. Individualization of the multipiece optical semiconductor device can be carried out by, for example, dicing processing using laser light. In the multipiece optical semiconductor device equipped with the multipiece element storage package 1D, the second plane conductor portion 37c of the first wiring conductor 37 and the fourth plane conductor portion 38c of the second wiring conductor 38 can be used as electrode pads for driving an optical semiconductor device obtained by dividing the multipiece optical semiconductor device into individual pieces. Thus, the multipiece optical semiconductor device equipped with the multipiece element storage package 1D does not need to undergo processing such as removal of unnecessary electrodes and formation of electrode pads necessary for driving the optical semiconductor device after individualization, and thus the productivity can be improved. Further, in the multipiece optical semiconductor device equipped with the multipiece element storage package 1D, the probe pins of the aging device do not abut on the first wiring conductor 37 and the second wiring conductor 38. Therefore, occurrence of defects due to aging can be suppressed and the productivity can be improved.

As described above, according to the multipiece element storage package 1D of the embodiment, it is possible to reduce time loss during aging and improve the productivity. Moreover, multipiece element storage package 1D does not include a dummy region. Therefore, the element storage package regions 31 can be arranged at a high density, and thus the productivity can be improved. Further, in the multipiece element storage package 1D, the surface of the frame body 36 opposite to the mother substrate 30 can be made flat. As a result, the surface of the frame body opposite to the mother substrate can be reliably sealed with the lid body or the like.

Next, an embodiment of the multipiece optical semiconductor device of the disclosure will be described with reference to the accompanying drawings.

Figure 9:
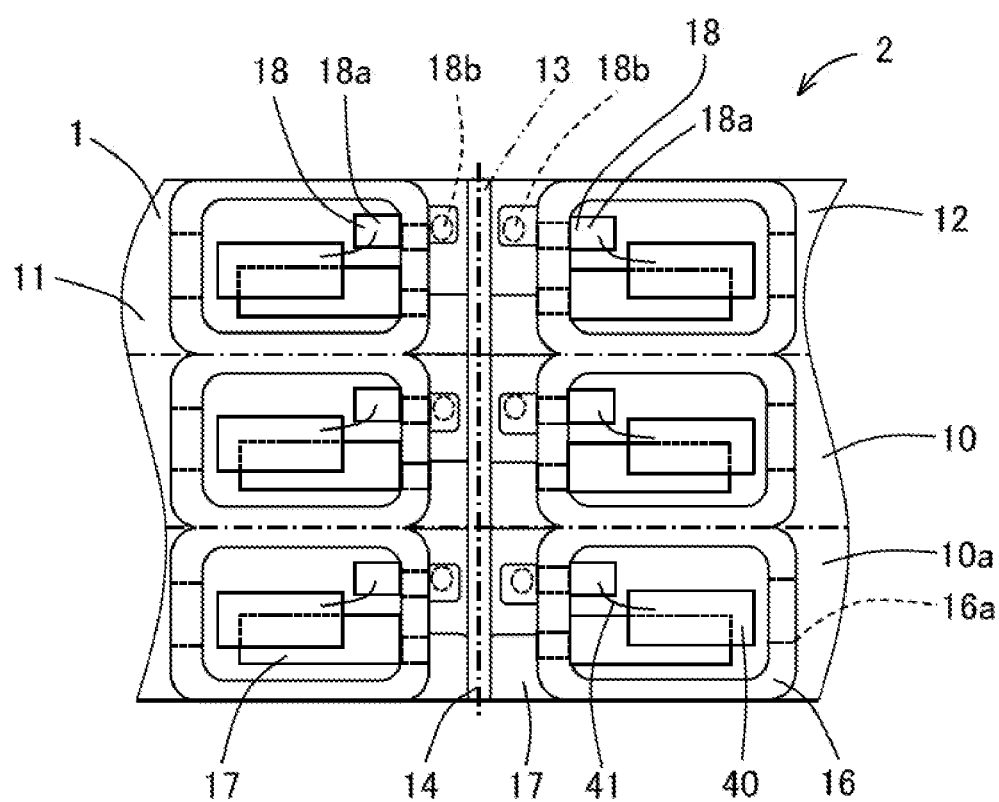
FIG. 9 is a plan view illustrating an example of an embodiment of a multipiece optical semiconductor device of the disclosure.

FIG. 9 is a plan view illustrating an example of the embodiment of the multipiece optical semiconductor device of the disclosure.

A multipiece optical semiconductor device 2 of the embodiment includes the multipiece element storage package 1 and the plurality of optical semiconductor elements 40. The plurality of optical semiconductor elements 40 are respectively mounted in the plurality of first element storage package regions 11 and the plurality of second element storage package regions 12. As the optical semiconductor element 40, an edge emitting semiconductor laser element can be used. The optical semiconductor element 40 is mounted such that the light emitting surface of the optical semiconductor element 40 faces the through-hole 16a formed in the frame body 16. In the optical semiconductor element 40, one electrode is connected to the first wiring conductor via a conductive bonding material such as solder, and the other electrode is electrically connected to a plane conductor portion of the second wiring conductor via the bonding wire 41. Accordingly, the optical semiconductor element 40 is mounted on each of the plurality of first element storage package regions 11 and the plurality of second element storage package regions 12.

The multipiece optical semiconductor device 2 may include a lid body disposed on a surface of the frame body 16 opposite to the mother substrate 10. The lid body is made of a metallic plate such as Fe—Ni—Co alloy or Fa-Ni alloy.

The multipiece optical semiconductor device 2 is equivalent to an optical semiconductor device array in which a large number of optical semiconductor devices are connected in parallel. Here, there is prepared an aging device including a large number of photodiodes capable of receiving light emitted from a large number of regions, each of which serves as an individual optical semiconductor device, a probe pin capable of abutting on the first stem electrode 14, and a probe pin capable of abutting on the electrode pad 19 connected to the second stem electrode 15. Next, the aging device is connected to the multipiece optical semiconductor device 2, and the multipiece optical semiconductor device 2 is energized via the probe pin. This makes it possible to collectively carry out aging on a large number of regions, each of which serves as an individual optical semiconductor device. Therefore, according to the multipiece optical semiconductor device 2, it is possible to reduce the time loss associated with individually connecting a large number of optical semiconductor devices to the aging device and improve the productivity. The aging may be carried out in a dry air atmosphere. Further, the aging may be carried out before sealing each first element storage package region 11 and each second element storage package region 12.

In addition, after aging is carried out, a large number of optical semiconductor devices can be manufactured by dividing the multipiece optical semiconductor device 2 into individual pieces along a planned dividing line (dash-dotted line) shown in FIG. 9. Individualization of the multipiece optical semiconductor device 2 can be carried out by, for example, dicing processing using laser light. When the multipiece optical semiconductor device 2 is divided into individual pieces, the dummy region 13 and the first stem electrode 14 and the second stem electrode 15 disposed in the dummy region 13 can be removed together. Further, the first wiring conductor 17 and a part of the second wiring conductor 18, which is the portion of the second plane conductor portion 18c located outside the frame body 16, can be used as electrode pads for driving the optical semiconductor device. In this way, the multipiece optical semiconductor device 2 does not need to undergo processing such as removal of unnecessary electrodes for the optical semiconductor devices and formation of electrode pads necessary for driving the optical semiconductor device after individualization, and thus the productivity can be improved. Further, in the multipiece optical semiconductor device 2, the probe pins of the aging device do not abut on the first wiring conductor 17 and the second wiring conductor 18. Therefore, occurrence of defects due to aging can be suppressed. As a result, the productivity can be improved.

Instead of the multipiece element storage package 1, the multipiece optical semiconductor device may be configured to include any one multipiece element storage package of the multipiece element storage packages 1A, 1B, 1C, and 1D described above. Even with such a configuration, the same effect as that of the multipiece optical semiconductor device 2 can be obtained.

The disclosure is not limited to the embodiments described above and various modifications may be made without departing from the scope of the invention.

REFERENCE SIGNS LIST 1, 1A, 1B, 1C, 1D: Multipiece element storage package
2: Multipiece optical semiconductor device
10: Mother substrate
10a: First surface
10b: Second surface
11: First element storage package region
12: Second element storage package region
13: Dummy region
14: First stem electrode
15: Second stem electrode
16: Frame body
16a: Through-hole
17: First wiring conductor
18: Second wiring conductor
18a: First plane conductor portion
18b: Penetrating portion
18c: Second plane conductor portion
19: Electrode pad
20: Mother substrate
20a: First surface
20b: Second surface
21: Element storage package region
22: First electrode pattern
23: First electrode pad
24: Second electrode pattern
25: Second electrode pad
26: Frame body
26a: Wall portion
26b: Notch portion
27: First wiring conductor
28: Second wiring conductor
28a: Plane conductor portion
28b: Through conductor portion
30: Mother substrate
30a: First surface
30b: Second surface
31: Element storage package region
34: First stem electrode
34a: First electrode pad
35: Second stem electrode
35a: Second electrode pad
36: Frame body
36a: Notch portion
37: First wiring conductor
37a: First plane conductor portion
37b: First through conductor portion
37c: Second plane conductor portion
38: Second wiring conductor
38a: Third plane conductor portion
38b: Second through conductor portion
38c: Fourth plane conductor portion
40: Optical semiconductor element
41: Bonding wire
42: Conductor layer

The invention claimed is:

1. A multipiece element storage package, comprising:
a mother substrate which comprises a plurality of first element storage package regions which are arranged along a first direction, a plurality of second element storage package regions which are arranged along the first direction and apart from the plurality of first element storage package regions in a second direction orthogonal to the first direction, a dummy region which is located between the plurality of first element storage package regions and the plurality of second element storage package regions, a first surface, and a second surface opposite to the first surface;
a first stem electrode which is disposed in a part of the dummy region, wherein the part of the dummy region is in the first surface and extends in the first direction; and
at least one second stem electrode which is disposed on the second surface,
the plurality of first element storage package regions and the plurality of second element storage package regions each comprising
a frame body disposed on the first surface,
a first wiring conductor disposed on the first surface, and comprising one first wiring conductor end located inside the frame body and another first wiring conductor end connected to the first stem electrode, and a second wiring conductor comprising one second wiring conductor end which is located on the first surface and inside the frame body, and another second wiring conductor end which is led to the second surface and is connected to the at least one second stem electrode.

2. The multipiece element storage package according to claim 1, wherein the at least one second stem electrode comprises a second stem electrode which is disposed in the dummy region and extends in the first direction.

3. The multipiece element storage package according to claim 1, wherein the at least one second stem electrode comprises a second stem electrode which is disposed along a boundary between the plurality of first element storage package regions and a boundary between the plurality of second element storage package regions, and which extends in the second direction.

4. The multipiece element storage package according to claim 1, wherein in a plan view of the multipiece element storage package, the plurality of first element storage package regions and the plurality of second element storage package regions are line-symmetric with respect to an imaginary line which passes through the dummy region and extends in the first direction.

5. The multipiece element storage package according to claim 1, wherein in a plan view of the multipiece element storage package, the plurality of first element storage package regions and the plurality of second element storage package regions are point-symmetric with respect to a centroid of a region comprising the plurality of first element storage package regions, the plurality of second element storage package regions, and the dummy region.

6. A multipiece optical semiconductor device, comprising:
the multipiece element storage package according to claim 1; and
a plurality of optical semiconductor elements mounted in the multipiece element storage package.

7. A multipiece element storage package, comprising:
a mother substrate which comprises a plurality of element storage package regions which are arranged in a matrix, a first surface, and a second surface opposite to the first surface;
a lattice-shaped frame body comprising a wall portion disposed on the first surface along a boundary of the plurality of element storage package regions;
a first electrode pattern disposed on a surface of the lattice-shaped frame body, wherein the surface of the lattice-shaped frame body is opposite to the mother substrate; and
a second electrode pattern disposed on the second surface,
the plurality of element storage package regions each comprising
a first wiring conductor comprising one first wiring conductor end which is located on the first surface and inside the lattice-shaped frame body, and another first wiring conductor end which is connected to the first electrode pattern, and
a second wiring conductor comprising one second wiring conductor end which is located on the first surface and inside the lattice-shaped frame body, and another second wiring conductor end which is led to the second surface and is connected to the second electrode pattern.

8. The multipiece element storage package according to claim 7, wherein the first wiring conductor comprises a wall surface conductor portion which is disposed on an inner wall surface of the lattice-shaped frame body and is connected to the first electrode pattern, and a plane conductor portion which is disposed on the first surface and is connected to the wall surface conductor portion.

9. A multipiece optical semiconductor device, comprising:
the multipiece element storage package according to claim 7; and
a plurality of optical semiconductor elements mounted in the multipiece element storage package.

10. A multipiece element storage package comprising:
a mother substrate which comprises a plurality of element storage package regions which are arranged in a matrix, a first surface, and a second surface opposite to the first surface;
at least one first stem electrode disposed on the second surface; and
at least one second stem electrode disposed on the second surface,
the plurality of element storage package regions each comprising
a frame body disposed on the first surface,
a first wiring conductor comprising one first wiring conductor end which is located on the first surface and inside the frame body, and another first wiring conductor end which is led to the second surface and is connected to the at least one first stem electrode, and
a second wiring conductor comprising one second wiring conductor end which is located on the first surface and inside the frame body, and another second wiring conductor end which is led to the second surface and is connected to the at least one second stem electrode.

11. The multipiece element storage package according to claim 10, wherein the at least one first stem electrode and the at least one second stem electrode are arranged along a boundary of the plurality of element storage package regions.

12. A multipiece optical semiconductor device, comprising:
the multipiece element storage package according to claim 10; and
a plurality of optical semiconductor elements mounted in the multipiece element storage package.

* * * * *